US010030138B2

(12) United States Patent
Nonomura et al.

(10) Patent No.: US 10,030,138 B2
(45) Date of Patent: Jul. 24, 2018

(54) HIGH THERMAL CONDUCTIVITY THERMOPLASTIC RESIN COMPOSITION WITH EXCELLENT INJECTION MOLDABILITY (71) Applicant: Kaneka Corporation, Osaka (JP)

(72) Inventors: Asato Nonomura, Osaka (JP); Soichi Uchida, Osaka (JP); Yasushi Noda, Osaka (JP)

(73) Assignee: Kaneka Corporation (JP)

(*) Notice: Subject to any disclaimer, the term of this patent is extended or adjusted under 35 U.S.C. 154(b) by 0 days.

(21) Appl. No.: 14/900,446

(22) PCT Filed: Jul. 1, 2014

(86) PCT No.: PCT/JP2014/067550
§ 371 (c)(1),
(2) Date: Dec. 21, 2015

(87) PCT Pub. No.: WO2015/002198
PCT Pub. Date: Jan. 8, 2015

(65) Prior Publication Data
US 2016/0152823 A1    Jun. 2, 2016

(30) Foreign Application Priority Data

Jul. 1, 2013    (JP) ................. 2013-138226

(51) Int. Cl.
C08L 67/02        (2006.01)
B29C 45/00        (2006.01)
(Continued)

(52) U.S. Cl.
CPC .......... C08L 67/02 (2013.01); B29C 45/0001 (2013.01); B29C 45/14811 (2013.01);
(Continued)

(58) Field of Classification Search
CPC ................. C08L 67/02; B29C 45/0001; B29C 45/14811; B29C 45/0005; B29C 45/0013; B29C 45/14; C09K 5/14
(Continued)

(56) References Cited

U.S. PATENT DOCUMENTS

2005/0245647 A1    11/2005    Masuda et al.
2006/0276573 A1    12/2006    Masuda et al.
2008/0277619 A1    11/2008    Matsumoto et al.

FOREIGN PATENT DOCUMENTS

CN    1167784 A    12/1997
CN    1646740 A    7/2005
(Continued)

OTHER PUBLICATIONS

International Search Report for Application No, PCT/JP2014/067550 dated Jan. 14, 2016.
(Continued)

Primary Examiner — Ling Siu Choi
Assistant Examiner — Ronald Grinsted
(74) Attorney, Agent, or Firm — Lerner, David, Littenberg, Krumholz & Mentlik, LLP (57) ABSTRACT A highly thermally conductive thermoplastic resin composition of the present invention contains: (A) a thermoplastic polyester resin having a weight average molecular weight of 50,000 to 200,000; (B) a polyalkylene terephthalate block copolymer composed of a polyether segment and a polyethylene terephthalate segment which includes an ethylene terephthalate unit as a main component; and (C) a highly thermally conductive inorganic compound, the highly thermally conductive thermoplastic resin composition containing, with respect to 100 parts by weight of (A) the thermoplastic polyester resin, 20 parts by weight to 200 parts by weight of (B) the polyalkylene terephthalate block copoly-
(Continued)

mer and 20 parts by weight to 250 parts by weight of (C) the highly thermally conductive inorganic compound.

17 Claims, 1 Drawing Sheet

(51) Int. Cl.
- *B29C 45/14* (2006.01)
- *C08K 3/34* (2006.01)
- *C08K 3/38* (2006.01)
- *C09K 5/14* (2006.01)
- *B29K 67/00* (2006.01)
- *B29L 31/18* (2006.01)

(52) U.S. Cl.
CPC .............. *C08K 3/34* (2013.01); *C08K 3/38* (2013.01); *C08L 67/025* (2013.01); *C09K 5/14* (2013.01); *B29C 45/0005* (2013.01); *B29C 45/0013* (2013.01); *B29C 45/14* (2013.01); *B29K 2067/003* (2013.01); *B29L 2031/18* (2013.01)

(58) Field of Classification Search
USPC ........................................................ 524/539
See application file for complete search history.

(56) References Cited

FOREIGN PATENT DOCUMENTS

| CN | 102453312 A | 5/2012 |
|---|---|---|
| CN | 102821956 A | 12/2012 |
| CN | 102993649 A | 3/2013 |
| EP | 0437942 A3 | 10/1991 |
| EP | 2679632 A1 | 1/2014 |
| JP | 01-306461 | 12/1989 |
| JP | 01-306462 A | 12/1989 |
| JP | 08-277332 | 10/1996 |
| JP | 08277332 A * | 10/1996 |
| JP | 3080724 B2 | 8/2000 |
| JP | 2007161747 A | 6/2007 |
| JP | 2009091440 A | 4/2009 |
| JP | 2009-275172 A | 11/2009 |
| JP | 2010-195890 A | 9/2010 |
| JP | 2012-031394 A | 2/2012 |
| JP | 2013-014757 A | 1/2013 |
| JP | 2013-028779 A | 2/2013 |
| JP | 2013028779 A * | 2/2013 |
| JP | 2013-089718 A | 5/2013 |
| JP | 2013089718 A * | 5/2013 |
| WO | 200766711 A1 | 6/2007 |
| WO | 2012169608 A1 | 12/2012 |

OTHER PUBLICATIONS

Supplementary European Search Report for Application No. EP14819782 dated Jan. 17, 2017.
International Search Report for Application No. PCT/JP2014/067550 dated Jul. 29, 2014.
International Preliminary Report on Patentability for Application No. PCT/JP2014/067550 dated Jan. 14, 2016.
Chinese Office Action for Application No. 201480035933.2 dated May 18, 2016.

* cited by examiner

HIGH THERMAL CONDUCTIVITY THERMOPLASTIC RESIN COMPOSITION WITH EXCELLENT INJECTION MOLDABILITY

CROSS-REFERENCE TO RELATED APPLICATION

The present application is a national phase entry under 35 U.S.C. § 371 of International Application No. PCT/JP2014/067550, filed Jul. 1, 2014, which claims priority from Japanese Application No.: 2013-138226, filed Jul. 1, 2013, all of which are incorporated herein by reference.

TECHNICAL FIELD

The present invention relates to a highly thermally conductive thermoplastic resin composition having excellent injection moldability.

BACKGROUND ART

Plastic has low thermal conductivity than inorganic substances such as metal materials. Therefore, there has conventionally been a problem that generated heat is not easily dissipated when thermoplastic resin molded articles are used for various items such as casings of personal computers or displays, materials of electronic devices, automotive interiors or exteriors, illumination members, and portable electronic devices like mobile phones. In order to solve this problem, it has been widely attempted to obtain a highly thermally conductive resin composition by mixing, with a thermoplastic resin, a large amount of a highly thermally conductive inorganic substance. Examples of such a highly thermally conductive inorganic compound encompass highly thermally conductive inorganic fillers such as graphite, carbon fiber, low-melting metal, alumina, and aluminum nitride. A thermoplastic resin composition filled with a large amount of such a filler has a problem that, since being filled with the large amount of the filler, the thermoplastic resin composition has extremely low weld strength.

As a method of increasing weld strength of a thermoplastic resin, Patent Literature 1 discloses, for example, a method in which an organic compound whose functional group is controlled is used for a thermoplastic resin composition filled with a small amount of a filler. However, according to the method disclosed in Patent Literature 1, it is necessary to produce the organic compound. Therefore, there are problems of costs and of time and effort. Meanwhile, Patent Literature 2 discloses, as an example, a method in which glass fiber having a given aspect ratio is used for a thermoplastic resin composition filled with a small amount of a filler. According to the method, a step of controlling a length of the glass fiber is needed after the glass fiber is melt-kneaded together with the thermoplastic resin composition. Moreover, the filler with which the thermoplastic resin composition is filled is limited to particular one and therefore, the thermoplastic resin composition may not be filled with a large amount of another filler. In a case where a thermoplastic resin is filled with a large amount of a filler, problems newly arise such that the thermoplastic resin has low moldability and has a weld portion low in strength.

In regard to a thermoplastic resin filed with a large amount of a filler, it has been thus difficult to produce, with use of the thermoplastic resin, a composition having excellent weld strength.

CITATION LIST

Patent Literature

[Patent Literature 1]
  Japanese Patent Application Publication, Tokukai, No. 2012-031394 A
[Patent Literature 2]
  Japanese Patent Application Publication, Tokukai, No. 2009-275172 A

SUMMARY OF INVENTION

Technical Problem

According to the conventional methods, it has been difficult to produce a highly thermally conductive resin composition which exhibits high thermal conductivity and has excellent weld strength.

Solution to Problem

In order to solve the above problems, the inventors of the present invention devoted themselves to studies and, as a result, found that a molded article exhibits excellent weld strength, the molded article being obtained by injection-molding a thermoplastic resin composition containing: (A) a thermoplastic polyester resin having a weight average molecular weight of 50,000 to 200,000; (B) a modifier that contains a polyalkylene terephthalate block copolymer composed of a polyether segment and a polyethylene terephthalate segment which includes an ethylene terephthalate unit as a main component; and (C) at least one kind of highly thermally conductive inorganic compound selected from the group consisting of graphite, electrically conductive metal powder, soft magnetic ferrite, carbon fiber, electrically conductive metal fiber, zinc oxide, boron nitride, aluminum nitride, silicon nitride, aluminum oxide, magnesium oxide, magnesium carbonate, aluminum hydroxide, magnesium hydroxide, beryllium oxide, and diamond. The inventors of the present invention thus completed the present invention.

That is, the present invention relates to a highly thermally conductive thermoplastic resin composition containing, with respect to 100 parts by weight of (A) a thermoplastic polyester resin, 20 parts by weight to 200 parts by weight of (B) a polyalkylene terephthalate block copolymer and 20 parts by weight to 250 parts by weight of (C) a highly thermally conductive inorganic compound, (A) the thermoplastic polyester resin having a weight average molecular weight of 50,000 to 200,000;

(B) the polyalkylene terephthalate block copolymer composed of a polyether segment and a polyethylene terephthalate segment which includes an ethylene terephthalate unit as a main component; and (C) the highly thermally conductive inorganic compound.

Advantageous Effects of Invention

According to the composition of the present invention, it is possible to produce a thermoplastic resin composition which exhibits high thermal conductivity and which has excellent strength, especially, a strong weld portion even in a case where the thermoplastic resin composition is filled with a large amount of a filler.

DESCRIPTION OF EMBODIMENTS

Examples of (A) the thermoplastic polyester resin used for the present invention encompass: amorphous thermoplastic polyester resins such as amorphous aliphatic polyesters, amorphous semiaromatic polyesters, and amorphous wholly aromatic polyesters; crystalline thermoplastic polyester resins such as crystalline aliphatic polyesters, crystalline semiaromatic polyesters, and crystalline wholly aromatic polyesters; liquid crystalline thermoplastic polyester resins such as liquid crystalline aliphatic polyesters, liquid crystalline semiaromatic polyesters, and liquid crystalline wholly aromatic polyesters.

Out of the examples of (A) the thermoplastic polyester resin, detailed examples of such crystalline thermoplastic polyesters encompass polyethylene terephthalate, polypropylene terephthalate, polybutylene terephthalate, polyethylene-2,6-naphthalate, polybutylene naphthalate, poly1,4-cyclohexylenedimethylene terephthalate, and polyethylene-1, 2-bis(phenoxy)ethane-4,4'-dicarboxylate as well as crystalline copolyesters such as polyethylene isophthalate/terephthalate, polybutylene terephthalate/isophthalate, polybutylene terephthalate/decanedicarboxylate, and polycyclohexane dimethyleneterephthalate/isophthalate.

Out of such crystalline polyesters, a polyalkylene terephthalate thermoplastic polyester resin is preferably used in view of a suitable crystallization speed, a considerable improvement in moldability, and excellent compatibility with (B) the polyalkylene terephthalate block copolymer. In particular, polyethylene terephthalate, polypropylene terephthalate, polybutylene terephthalate, polyethylene-2,6-naphthalate, polybutylene naphthalate, poly 1,4-cyclohexylenedimethyleneterephthalate, or the like is preferably used.

Furthermore, (A) the thermoplastic polyester resin is preferably a polyethylene terephthalate thermoplastic polyester resin because it (i) allows moldability to be further optimized and (ii) causes a resultant composition to be excellent in strength and rigidity.

In a case where the polyethylene terephthalate thermoplastic polyester resin is used as (A) the thermoplastic polyester resin, it is effective to use generally so-called APET (Amorphous Polyethylene Terephthalate). Detailed examples of an APET compound encompass a terephthalic acid-ethylene glycol-bisphenol A ethylene oxide addition (1 to 4) condensation polymer. Note here that APET is identified by the following analysis using differential scanning calorimetry. That is, a resin pellet is heated at 280° C. for 30 seconds. Immediately after that, a resultant sample is cooled down with use of ice, and is then subjected to measurement while a temperature of the sample is being increased at 10 Cel/min. The sample which does not clearly show a melting peak in a range of not less than 200° C. or whose heat quantity of melting is not more than 50 J/g is APET. Even in a case where the sample is not APET, an improvement in weld strength can be expected when the heat quantity of melting is not more than 100 J/g.

A weight average molecular weight of the thermoplastic polyester resin used for the present invention is 50,000 to 200,000. The weight average molecular weight of the thermoplastic polyester resin is generally 50,000 to 195,000, preferably 50,000 to 190,000, more preferably 80,000 to 180,000. In a case where the weight average molecular weight is not more than 50,000, strength, durability, and the like of a molded article obtained from the thermoplastic polyester resin are lower than desired ones. Therefore, it is not preferable that the weight average molecular weight is not more than 50,000. The weight average molecular weight may be more than 200,000. However, this may cause a deterioration in molding processability, thereby causing a deterioration in strength, durability, and the like of the molded article obtained from the thermoplastic polyester resin. An IV value of the thermoplastic polyester resin used for the present invention is generally 1.0 to 1.4.

(B) The polyalkylene terephthalate block copolymer used for the present invention is a polyalkylene terephthalate block copolymer composed of a polyether segment and a polyalkylene terephthalate segment, the polyalkylene terephthalate segment including an alkylene terephthalate unit as a main component, the polyether segment (i) having a molecular weight of not less than 400 and (ii) being at least one kind selected from the group consisting of a polyether compound represented by general formula (1) and a polyether compound represented by general formula (2):

$$HO-(R^1O)_k-H \quad (1)$$

where $R^1$ denotes an alkyl group having 2 to 5 carbon atoms, k denotes an integer of 5 or more, and $R^1$ of $(R^1O)_k$ may be identical to or different from each other;

$$H-(OR^2)_m-O\text{-}Ph\text{-}X\text{-}Ph\text{-}O-(R^2O)_n-H \quad (2)$$

where $R^2$ denotes an alkyl group having 2 to 5 carbon atoms, X denotes $-C(CH_3)_2-$ or $-SO_2-$, Ph denotes $C_6H_4$, m and n each independently denote an integer of 1 or more, m+n indicates an integer of 3 or more, and $R^2$ of $(OR^2)_m$ and $(R^2O)_n$ may be identical to or different from each other. A method of producing the polyether segment and a method of producing the polyalkylene terephthalate segment are each not limited in particular. A known method can be employed so as to produce each of the polyether segment and the polyalkylene terephthalate segment.

Out of such copolymer components, the polyalkylene terephthalate segment includes the alkylene terephthalate unit as the main component. The alkylene terephthalate unit is obtained with use of (i) terephthalic acid or a derivative thereof having ester forming ability as an acid component and (ii) alkylene glycol or a derivative thereof having ester forming ability as a glycol component. According to the present invention, the phase "including an alkylene terephthalate unit as a main component" indicates that not less than 80 mol % of a polyester segment is composed of the alkylene terephthalate segment.

Examples of a polymerization method for obtaining the polyalkylene terephthalate segment encompass the following method. That is, first, a polymer having a low polymerization degree is synthesized, for example, by directly esterifying terephthalic acid and alkylene glycol, such as ethylene glycol and tetramethylene glycol, under the presence or in the absence of a catalyst or by transesterifying dimethyl terephthalate and alkylene glycol under the presence of a catalyst. Next, the polymer, having the low polymerization degree, and a catalyst compound, such as antimony, titanium, and germanium, are subjected to melt polycondensation or solid-state polycondensation at a temperature of, for example, approximately 230° C. to 300° C. under vacuum of, for example, not more than 1 (one) Torr. This causes the polyalkylene terephthalate segment to be produced.

Examples of the alkylene glycol encompass compounds, such as ethylene glycol, propylene glycol, butanediol, hexanediol, decanediol, neopentylglycol, cyclohexanedimethanol, and cyclohexanediol, and derivatives thereof having ester forming ability.

In view of a suitable crystallization speed and a considerable improvement in moldability, the polyalkylene terephthalate segment of which (B) the polyalkylene terephthalate block copolymer is composed is preferably a polyethylene terephthalate segment. Out of the copolymer components, the polyether segment is at least one kind selected from the group consisting of (i) the polyether compound represented by the general formula (1) and (ii) the polyether compound represented by the general formula (2):

HO—(R$^1$O)$_k$—H    (1)

where R$^1$ denotes an alkyl group having 2 to 5 carbon atoms, k denotes an integer of 5 or more, and R$^1$ of (R$^1$O)$_k$ may be identical to or different from each other;

H—(OR$^2$)$_m$—O-Ph-X-Ph-O—(R$^2$O)$_n$—H    (2)

where R$^2$ denotes an alkyl group having 2 to 5 carbon atoms, X denotes —C(CH$_3$)$_2$— or —SO$_2$—, Ph denotes C$_6$H$_4$, m and n each denote an integer of 1 or more, m+n indicates an integer of 3 or more, and R$^2$ of (OR$^2$)$_m$ and (R$^2$O)$_n$ may be identical to or different from each other. The polyether segment has a molecular weight of 400. In a case where a polyether compound other than such polyether compounds is used, a crystallization speed of the polyalkylene terephthalate block copolymer is excessively increased and accordingly, the effect of the present invention may not be achieved.

Detailed examples of the polyether segment encompass polyethylene glycol, polypropylene glycol, polytetramethylene glycol, a poly(ethylene oxide•propylene oxide) copolymer, a poly(ethylene oxide•tetrahydrofuran) copolymer, and a poly(ethylene oxide•propylene oxide•tetrahydrofuran) copolymer. The detailed examples of the polyether segment also encompass alkylene oxide addition polymers (such as ethylene oxide addition polymers, propylene oxide addition polymers, and tetrahydrofuran addition polymers) of bisphenol (such as bisphenol A and bisphenol S).

In view of thermal stability and thermal durability, the polyether segment is preferably composed of at least one of the bisphenol alkylene oxide addition polymers. Out of the bisphenol alkylene oxide addition polymers, preferably used is a bisphenol A ethylene oxide addition polymer, a bisphenol A propylene oxide addition polymer, a bisphenol A tetrahydrofuran addition polymer, a bisphenol A (ethylene oxide•propylene oxide) addition polymer, a bisphenol S ethylene oxide addition polymer, a bisphenol S propylene oxide addition polymer, a bisphenol S tetrahydrofuran addition polymer, or a bisphenol S (ethylene oxide•propylene oxide) addition polymer.

The molecular weight of each of the polyether compounds is not less than 400, preferably 600 to 6000, more preferably 800 to 3000. In a case where the molecular weight is less than 400, a resultant block copolymer is low in mechanical strength, moldability, and the like. Therefore, it is not preferable that the molecular weight is less than 400. In a case where the molecular weight is more than 6000, each of the polyether compounds is low in compatibility with a polyethylene terephthalate resin. This may cause a decrease in reactivity, a decrease in mechanical strength of the resultant block copolymer, and the like. Each of the polyether compounds can be used solely or two or more of the polyether compounds which two or more are different in kind and/or molecular weight can be used in combination.

A ratio between the polyether segment and the polyalkylene terephthalate segment is as follows. That is, assuming that the polyether segment and the polyalkylene terephthalate segment are collectively regarded as 100% by weight, the polyether segment is 3% by weight to 80% by weight, preferably 10% by weight to 70% by weight, more preferably 15% by weight to 60% by weight, most preferably 20% by weight to 50% by weight. In a case where a copolymerization amount of the polyether segment is less than 3% by weight, this causes an effect of improvement in molding processability to be small. In a case where the copolymerization amount of the polyether segment is more than 80% by weight, this tends to result in a decrease in thermal durability, moisture durability, moldability, and the like.

A method of polycondensing the polyalkylene terephthalate segment and the polyether segment is not limited in particular. Examples of the method encompass the following methods. That is, the polyether compound is added to a polyalkylene terephthalate resin which has been melted in advance, and a resultant mixture is subjected to melt polycondensation under a reduced pressure. Alternatively, (i) the polyether compound is heated to approximately 80° C. to 250° C. under a reduced pressure or under an inert gas atmosphere and/or under the presence of an antioxidant, (ii) the polyalkylene terephthalate resin is added to the polyether compound intermittently, continuously, or collectively, and (iii) a resultant mixture is subjected to melt polycondensation under a reduced pressure. Alternatively, the polyether compound is dry-blended with the polyalkylene terephthalate resin in the form of a pellet, a flake, or a powder, and then the resultant mixture is subjected to melt polycondensation with use of a mixing machine such as an extruder and a kneader. After such melt polycondensation, solid phase polymerization can be further preferably carried out.

In a case where (B) the polyalkylene terephthalate block copolymer is produced, an antioxidant (such as: a phenolic antioxidant; a phosphorous compound or a phosphorous antioxidant; or a sulfur antioxidant), a thermal stabilizer, a color protecting agent, and the like can be added before, during, or after a reaction so as to, for example, suppress coloring, thermal degradation, oxidative degradation, and the like. Furthermore, a phosphate compound (such as phosphoric acid, phosphorous acid, hypophosphorous acid, monomethyl phosphate, dimethyl phosphate, trimethyl phosphate, methyl diethyl phosphate, triethyl phosphate, triisopropyl phosphate, tributyl phosphate, triphenyl phosphate, tribenzyl phosphate, tricyclohexyl phosphate, trimethyl phosphite, methyl diethyl phosphite, triethyl phosphite, triisopropyl phosphite, tributyl phosphite, and triphenyl phosphite) can be added after esterification or transesterification so as to, for example, improve a color tone.

Moreover, with respect to (B) the polyalkylene terephthalate block copolymer, a known copolymerizable component can be used in such a range that the known copolymerizable component does not cause a deterioration in reactivity or a deterioration in mechanical property or chemical property of (B) the polyalkylene terephthalate block copolymer to be obtained. Examples of the known copolymerizable component encompass: carboxylic acids such as divalent or more aromatic carboxylic acids having 8 to 22 carbon atoms, divalent or more aliphatic carboxylic acids having 4 to 12 carbon atoms, and divalent or more alicyclic carboxylic acids having 8 to 15 carbon atoms; and ester-forming derivatives of thereof. The examples of the known copolymerizable component also encompass: aromatic compounds having 6 to 40 carbon atoms and two or more hydroxyl groups in a molecule; and ester-forming derivatives thereof.

Detailed examples of the carboxylic acids encompass terephthalic acid, isophthalic acid, naphthalene dicarboxylic acid, bis(p-carboxyphenyl)methane anthracene dicarboxylic acid, 4,4'-diphenyl dicarboxylic acid, 1,2-bis(phenoxy)ethane-4,4'-dicarboxylic acid, adipic acid, sebacic acid, azelaic acid, dodecanedioic acid, maleic acid, trimesic acid, trimellitic acid, pyromellitic acid, 1,3-cyclohexanedicarboxylic acid, 1,4-cyclohexanedicarboxylic acid, decahydronaphthalene dicarboxylic acid, and derivatives thereof having ester forming ability. Meanwhile, examples of the aromatic compounds having two or more hydroxyl groups encompass alkylene glycol, 2,2'-bis(4-hydroxyphenyl)propane, 2,2'-bis(hydroxycyclohexyl)propane, hydroquinone, glycerin, pentaerythritol, and derivatives thereof having ester forming ability. Moreover, a hydroxy acid such as p-hydroxy benzoic acid or p-hydroxyethoxy benzoic acid, an ester-forming derivative of a hydroxy acid, a cyclic ester such as ε-caprolactone, or the like can be also used. A copolymerization amount of the known copolymerizable component is approximately not more than 20% by weight, preferably not more than 15% by weight, more preferably not more than 10% by weight.

Furthermore, according to the present invention, it is possible to obtain a high-molecular weight copolymer in a relatively short time by adding a polyfunctional compound selected from the group consisting of epoxy compounds having at least 2 reactive groups, organic carboxylic acids and/or organic carboxylic acid anhydrides, oxazoline compounds, isocyanate compounds, and the like. This is effective in view of thermal stability of the block copolymer.

Detailed examples of the epoxy compounds encompass: bisphenol epoxy resins; novolac epoxy resins; polyvalent aliphatic glycidyl ether compounds; polyvalent alicyclic glycidyl ether compounds; polyvalent aromatic glycidyl ether compounds; polyvalent aliphatic glycidyl ester compounds; polyvalent alicyclic glycidyl ester compounds; polyvalent aromatic glycidyl ester compounds; epoxy compounds each obtained by epoxidizing, with acetic acid and peracetic acid, an aliphatic compound having more than one unsaturated groups or an alicyclic compound having more than one unsaturated groups; polyvalent aliphatic glycidylamine compounds; polyvalent alicyclic glycidylamine compounds; and polyvalent aromatic glycidylamine compounds.

The detailed examples of the epoxy compounds encompass: alkylene glycol diglycidyl ethers such as ethylene glycol diglycidyl ether, propylene glycol diglycidyl ether, tetramethylene glycol diglycidyl ether, neopentyl glycol diglycidyl ether, and 1,6-hexanediol diglycidyl ether; polyalkylene glycol diglycidyl ethers such as polyethylene glycol diglycidyl ether, polypropylene glycol diglycidyl ether, and polytetramethylene glycol diglycidyl ether; erythrite polyglycidyl ether; trimethylolpropane polyglycidyl ether; pentaerythritol polyglycidyl ether; diglycerol polyglycidyl ether; polyglycerol polyglycidyl ether; terephthalic acid diglycidyl ester; isophthalic acid diglycidyl ester; adipic acid diglycidyl ester; diglycidyl aniline; tetraglycidyl 4,4'-diaminodiphenyl methane; triglycidyl tris (2-hydroxyethyl) isocyanurate; polyepoxy compounds of higher oils and fats; bisphenol A epoxy resin; bisphenol S epoxy resin; epoxidized phenol novolac; and epoxidized cresol novolac. Each of those compounds is used solely or two or more of those compounds are used in combination.

Examples of the organic carboxylic acids encompass trimellitic acid and pyromellitic acid. Examples of the organic carboxylic acid anhydrides encompass tetracarboxylic dianhydrides such as pyromellitic dianhydride, benzophenone dianhydride, 2,2-bis(3,4-dicarboxyphenyl)propane dianhydride, 3,3', 4,4'-biphenyl tetracarboxylic dianhydride, bis(3,4-dicarboxyphenyl)ether dianhydride, bis(3,4-dicarboxyphenyl)thioether dianhydride, bisphenol A bisether dianhydride, 2,2-bis(3,4-dicarboxyphenyl)hexafluoropropane dianhydride, 2,3,6,7-naphtarene tetracarboxylic dianhydride, bis(3,4-dicarboxyphenyl)sulfone dianhydride, 1,2,5,6-naphthalene tetracarboxylic dianhydride, and 2,2',3,3'-biphenyl tetracarboxylic dianhydride. Each of those compounds is used solely or two or more of those compounds are used in combination.

Examples of the oxazoline compounds encompass 2,2'-methylenebis(2-oxazoline), 2,2'-ethylenebis(2-oxazoline), 2,2'-ethylenebis(4-methyl-2-oxazoline), 2,2'-propylenebis(2-oxazoline), 2,2'-tetramethylenebis(2-oxazoline), 2,2'-hexamethylenebis(2-oxazoline), 2,2'-p-phenylenebis(2-oxazoline), 2,2'-m-phenylenebis(2-oxazoline), 2,2'-o-phenylenebis(2-oxazoline), 2,2'-bis(2-oxazoline), tri(2-oxazoline)methane, tri(2-oxazoline)ethane, and tri(2-oxazoline)benzene. Each of those compounds is used solely or two or more those compounds are used in combination.

Examples of the isocyanate compounds encompass hexamethylene diisocyanate.

A method of adding the polyfunctional compound is not limited in particular, and a general method can be employed. Examples of the method encompass: a method in which the polyfunctional compound is added at any stage before the aforementioned polycondensation is finished; a method in which the polyfunctional compound is added under an inert gas atmosphere after the polycondensation is finished; and a method in which, after a copolymer in the form of a pellet, a flake, or a powder is obtained, the polyfunctional compound is added to and melt-kneaded with the copolymer with use of an extruder or a kneader.

Intrinsic viscosity of the polyalkylene terephthalate block copolymer obtained is preferably not less than 0.35, more preferably 0.40 to 2.00, even more preferably 0.50 to 1.20. In a case where the intrinsic viscosity is less than 0.35, this may cause a deterioration in mechanical property and moldability of such an obtained block copolymer. In a case where the intrinsic viscosity is more than 2.00, this may cause a deterioration in moldability of the block copolymer.

To the highly thermally conductive thermoplastic resin composition of the present invention, a thermoplastic resin other than the aforementioned (A) and (B) can be added. Examples of the thermoplastic resin other than (A) and (B) encompass: aromatic vinyl resins such as polystyrene; vinyl-cyanide resin such as polyacrylonitrile; chlorine resins such as polyvinyl chloride; polymethacrylic acid ester resins such as polymethyl methacrylate; polyacrylic acid ester resins; polyolefin resins such as polyethylene, polypropylene, and cyclic polyolefin resins; polyvinyl ester resins such as polyvinyl acetate; polyvinyl alcohol resins; derivative resins of those resins; polymethacrylic acid resins and metal salt resins thereof; polyacrylic acid resins and metal salt resins thereof; poly-conjugated diene resins; polymers obtained by polymerizing maleic acid, fumaric acid, and derivatives thereof; polymers obtained by polymerizing maleimide compounds; polyamide resins such as aliphatic polyamide, aliphatic-aromatic polyamide, and wholly aromatic polyamide; polycarbonate resins; polyurethane resins; polysulfone resins; polyalkylene oxide resins; cellulosic resins; polyphenylene ether resins; polyphenylene sulfide resins;

polyketone resins; polyimide resins; polyamideimide resins; polyetherimide resins; polyether ketone resins; polyether ether ketone resins; polyvinyl ether resins; phenoxy resins; fluorine resins; silicone resins; liquid crystal polymers; and random/block/graft copolymers of the above listed polymers. Each of those resins can be used solely as the thermoplastic resin other than (A) and (B). Alternatively, two or more of those resins can be used in combination as the thermoplastic resin other than (A) and (B). In a case where two or more of those resins are used in combination, a compatibilizer or the like can be added thereto as necessary. The thermoplastic resin other than (A) and (B) may be selected as appropriate depending on a purpose.

Out of the resins serving as the thermoplastic resin other than (A) and (B), a partially or wholly crystalline thermoplastic resin or a partially or wholly liquid crystalline thermoplastic resin is preferably used because (i) a resultant resin composition tends to have high thermal conductivity and (ii) such a resin can be each easily mixed with (C) the inorganic compound. Such a crystalline or liquid crystalline thermoplastic resin may be wholly crystalline. Alternatively, the crystalline or liquid crystalline thermoplastic resin may be partially crystalline or liquid crystalline (e.g., only a particular block in a molecule of a block or graft copolymer resin may be crystalline or liquid crystalline). Crystallinity of the crystalline or liquid crystalline thermoplastic resin is not limited in particular. As the thermoplastic resin other than (A) and (B), a polymer alloy made up of (i) an amorphous resin and a crystalline resin or (ii) an amorphous resin and a liquid crystalline resin can be alternatively used. Crystallinity of such a resin is not limited in particular.

The partially or wholly crystalline thermoplastic resin or the partially or wholly liquid crystalline thermoplastic resin, each serving as the thermoplastic resin other than (A) and (B), encompass a resin that shows an amorphous property when the resin is used solely or is molded under a particular molding process condition, even though the resin can be crystallized. In a case where such a resin is employed, it may be possible to partially or wholly crystallize the resin by (i) adjusting an amount of (C) the inorganic compound to be added or adjusting a method of adding (C) the inorganic compound or (ii) modifying a molding process, e.g., carrying out a stretching process or a post-crystallization process.

Out of such crystalline or liquid crystalline thermoplastic resins, a crystalline polyamide resin, a polyphenylene sulfide resin, a liquid crystal polymer, a crystalline polyolefin resin, a polyolefin block copolymer, or the like is preferably used. Note, however, that the crystalline or liquid crystalline thermoplastic resins are not limited to such, and various crystalline resins and liquid crystalline resins can be used.

An amount of (B) the polyalkylene terephthalate block copolymer added with respect to 100 parts by weight of (A) the thermoplastic polyester resin is preferably 20 parts by weight to 200 parts by weight in view of improvement in moldability or weld strength. In view of prevention of deterioration in mechanical strength or prevention of a cost increase, the amount of (B) the polyalkylene terephthalate block copolymer is preferably not more than 150 parts by weight.

As (C) the highly thermally conductive inorganic compound added to the thermoplastic resin composition of the present invention, one that has thermal conductivity of not less than 10 W/m·K by itself can be used. The thermal conductivity of (C) the highly thermally conductive inorganic compound itself is preferably not less than 12 W/m·K, more preferably not less than 15 W/m·K, even more preferably not less than 20 W/m·K, most preferably not less than 30 W/m·K. An upper limit of the thermal conductivity of (C) the highly thermally conductive inorganic compound itself is not limited in particular. The higher the upper limit is, the more preferable it is. The upper limit is generally not more than 3000 W/m·K, preferably not more than 2500 W/m·K.

In a case where the thermoplastic resin composition of the present invention is used for a purpose that does not particularly require the thermoplastic resin composition to have an electric insulation property, a metal compound or an electrically conductive carbon compound is preferably used as (C) the highly thermally conductive inorganic compound. In particular, an electrically conductive carbon material such as graphite and carbon fiber, electrically conductive metal powder obtained by processing metal into fine particles, electrically conductive metal fiber obtained by processing metal into fibers, ferrite, or a metal oxide such as zinc oxide can be preferably used due to their excellent thermal conductivity.

In a case where the thermoplastic resin composition of the present invention is used for a purpose that requires the thermoplastic resin composition to have an electric insulation property, a compound having an electric insulation property is preferably used as (C) the highly thermally conductive inorganic compound. Note, here, that, specifically, the electric insulation property indicates a property of having an electric resistivity of not less than 1 (one) Ω·cm. The electric insulation property is preferably not less than 10 Ω·cm, more preferably not less than $10^5$ Ω·cm, even more preferably not less than $10^{10}$ Ω·cm, most preferably not less than $10^{13}$ Ω·cm. An upper limit of the electric resistivity is not limited in particular, and is generally not more than $10^{18}$ Ω·cm. An electric insulation property of a molded article obtained from the highly thermally conductive thermoplastic resin composition of the present invention also preferably falls within the above range.

Among the (C) the highly thermally conductive inorganic compound, detailed examples of the compound having the electric insulation property encompass: metal oxides such as talc, aluminum oxide, magnesium oxide, silicon oxide, beryllium oxide, copper oxide, and cuprous oxide; metal nitrides such as boron nitride, aluminum nitride, and silicon nitride; metal carbides such as silicon carbide; metal carbonates such as magnesium carbonate; insulating carbon materials such as diamond; and metal hydroxides such as aluminum hydroxide and magnesium hydroxide.

Out of those compounds, since being excellent in electric insulation property, the metal nitrides such as talc, boron nitride, aluminum nitride, and silicon nitride, the metal oxides such as aluminum oxide, magnesium oxide, and beryllium oxide, the metal carbonates such as magnesium carbonate, the metal hydroxides such as aluminum hydroxide and magnesium hydroxide, and the insulating carbon materials such as diamond are more preferable. Each of those compounds is used solely or two or more of those compounds are used in combination.

(C) The highly thermally conductive inorganic compound can be in various forms. Examples of the various forms encompass a particle form, a fine particle form, a nanoparticle form, an agglomerated particle form, a tube form, a nanotube form, a wire form, a rod form, a needle form, a plate form, ページ:29
an amorphous form, a rugby ball form, a hexahedron form, a composite particle form in which a large particle and a fine particle are combined with each other, and a liquid form. (C) The highly thermally conductive inorganic compound can be either a natural compound or a synthetic compound. In a case where (C) the highly thermally conductive inorganic compound is a natural compound, for example, a place from which the natural compound comes is not limited in particular. The natural compound can be selected as appropriate. Each of the aforementioned compounds can be used solely as (C) the highly thermally conductive inorganic compound. Alternatively, two or more of the aforementioned compounds which two or more are different in form, average particular size, type, surface treatment agent, and the like can be used in combination as (C) the highly thermally conductive inorganic compound.

(C) The highly thermally conductive inorganic compound can be surface-treated with use of a surface treatment agent such as a silane treatment agent so as to increase interfacial adhesiveness between the resin and the inorganic compound and to facilitate workability. The surface treatment agent is not limited in particular, and a conventionally known surface treatment agent such as a silane coupling agent and a titanate coupling agent can be used. Especially, an epoxy group containing silane coupling agent such as epoxysilane, an amino group containing silane coupling agent such as aminosilane, polyoxyethylene silane, or the like is preferably used because each of such silane coupling agents hardly deteriorates a property of the resin. A method of surface-treating the inorganic compound is not limited in particular, and a general treatment method can be employed.

The amount of (C) the highly thermally conductive inorganic compound to be added with respect to 100 parts by weight of (A) the thermoplastic polyester resin is generally not less than 20 parts by weight, preferably not less than 50 parts by weight, in view of achievement of high thermal conductivity. Alternatively, the amount of (C) the highly thermally conductive inorganic compound can be not less than 80 parts by weight so that the thermoplastic resin composition of the present invention is filled with a large amount of a filler. In view of moldability, the amount of (C) the highly thermally conductive inorganic compound is generally not more than 250 parts by weight, preferably not more than 200 parts by weight.

To the thermoplastic resin composition of the present invention, an inorganic compound other than (C) can be further added, so as to further increase heat resistance or mechanical strength of the resin composition, in such a range that the inorganic compound other than (C) does not cause a deterioration in characteristic of the present invention. The inorganic compound other than (C) is not limited in particular. Note, however, that, in a case where the inorganic compound other than (C) is added, this may adversely affect the thermal conductivity. Therefore, an amount and the like of the inorganic compound to be added need to be carefully determined.

The inorganic compound other than (C) can be also surface-treated. In a case where the inorganic compound other than (C) is used, an amount of the inorganic compound other than (C) to be added with respect to 100 parts by weight of (B) the polyalkylene terephthalate block copolymer is preferably not more than 100 parts by weight. In a case where the amount of the inorganic compound other than (C) is more than 100 parts by weight, this may cause a deterioration in impact resistance as well as a deterioration in molding processability. The amount of the inorganic compound other than (C) is preferably not more than 50 parts by weight, more preferably not more than 10 parts by weight. Note that, as the amount of the inorganic compound other than (C) is increased, a surface property or dimensional stability of a molded article tends to be deteriorated. Therefore, in a case where such properties are important, it is preferable to set the amount of the inorganic compound other than (C) as small as possible.

The composition of the present invention can contain (D) at least one of a flame retarder and an auxiliary flame retarder. (D) The at least one of the flame retarder and the auxiliary flame retarder is preferably selected, for example, from the group consisting of a halogen flame retarder, a phosphorus flame retarder, an antimony compound, and magnesium hydroxide.

Moreover, the composition of the present invention can contain (E) tempered glass fiber. (E) The tempered glass fiber after extrusion generally has a length of 0.1 µm to 1000 µm, but preferably has a length of 50 µm to 500 µm. (E) The tempered glass fiber generally has a single fiber diameter of 0.1 µm to 50 µm, but preferably has a single fiber diameter of 5 µm to 20 µm. Further, (E) the tempered glass fiber after the extrusion preferably has a length of 0.1 µm to 1000 µm and a single fiber diameter of 0.1 µm to 50 µm.

Furthermore, one or more of thermal stabilizers such as a phenolic stabilizer, a sulfuric stabilizer, and a phosphorus stabilizer is/are preferably added to the thermoplastic resin composition of the present invention so that the thermoplastic resin composition has higher performance. Moreover, one or more of commonly known agents, such as a stabilizer, a lubricant, a mold release agent, a plasticizer, a flame retarder other than a phosphorus flame retarder, an auxiliary flame retarder, an ultraviolet absorbent, a photo stabilizer, a pigment, a dye, an antistatic agent, an electric conductivity imparting agent, a dispersing agent, a compatibilizer, and an antibacterial agent, can be added to the thermoplastic resin composition.

A method of producing the thermoplastic resin composition of the present invention is not limited in particular. For example, the thermoplastic resin composition can be produced in such a way that (i) the aforementioned components, additives, and the like are dried and then (ii) the components, additives, and the like are melt-kneaded with use of a melt-kneading machine such as a signal- or twin-screw extruder. In a case where the components and the like to be added are liquid, the components and the like are put in the melt-kneading machine with use of, for example, a liquid supply pump before melt-kneading is finished.

A method of molding the thermoplastic resin composition of the present invention is not limited in particular. For example, a commonly used method of molding a thermoplastic resin, such as injection molding, blow molding, extrusion molding, vacuum molding, press molding, or calendar molding, can be employed. Out of those methods, the injection molding is preferably employed because, for example, (i) a molding cycle is short and therefore excellent productivity is attained and (ii) flowability of the composition of the present invention is good during the injection molding.

The composition of the present invention exhibits good thermal conductivity as described in Examples. It is therefore possible to obtain a molded article having thermal conductivity of not less than 0.8 W/m·K, preferably not less than 1 (one) W/m·K, more preferably not less than 1.3 W/m·K.

According to the resin composition of the present invention, it is possible to further improve its moldability by adding a crystallization accelerator such as a nucleating agent as necessary.

Examples of the crystallization accelerator encompass higher fatty acid amides, urea derivatives, sorbitol compounds, higher fatty acid salts, and aromatic fatty acid salts. Each of those compounds can be used solely or two or more of those compounds can be used in combination. Out of those compounds, the higher fatty acid amides, the urea derivatives, and the sorbitol compounds are preferable because they have a high effect as the crystallization accelerator.

Examples of the higher fatty acid amides encompass behenic acid amide, oleic amide, erucic acid amide, stearic acid amide, palmitic acid amide, N-stearylbehenic acid amide, N-stearylerucic acid amide, ethylenebisstearic acid amide, ethylenebisoleic amide, ethylenebiserucic acid amide, ethylenebislauryl acid amide, ethylenebiscapric acid amide, p-phenylenebisstearic acid amide, and a condensation polymer of ethylenediamine, stearic acid, and sebacic acid. In particular, behenic acid amide is preferably used.

Examples of the urea derivatives encompass bis(stearylureido)hexane, 4,4'-bis(3-methylureido)diphenylmethane, 4,4'-bis(3-cyclohexylureido)diphenylmethane, 4,4'-bis(3-cyclohexylureido)dicyclohexylmethane, 4,4'-bis(3-phenylureido)dicyclohexylmethane, bis(3-methylcyclohexylureido)hexane, 4,4'-bis(3-decylureido)diphenylmethane, N-octyl-N'-phenylurea, N,N'-diphenylurea, N-tolyl-N'-cyclohexylurea, N,N'-dicyclohexylurea, N-phenyl-N'-tribromophenylurea, N-phenyl-N'-tolylurea, and N-cyclohexyl-N'-phenylurea. In particular, bis(stearylureido)hexane is preferably used.

Examples of the sorbitol compounds encompass 1,3,2,4-di(p-methylbenzylidene)sorbitol, 1,3,2,4-dibenzylidenesorbitol, 1,3-benzylidene-2,4-p-methylbenzylidenesorbitol, 1,3-benzylidene-2,4-p-ethylbenzylidenesorbitol, 1,3-p-methylbenzylidene-2,4-benzylidenesorbitol, 1,3-p-ethylbenzylidene-2,4-benzylidenesorbitol, 1,3-p-methylbenzylidene-2,4-p-ethylbenzylidenesorbitol, 1,3-p-ethylbenzylidene-2,4-p-methylbenzylidenesorbitol, 1,3,2,4-di(p-ethylbenzylidene)sorbitol, 1,3,2,4-di(p-n-propylbenzylidene)sorbitol, 1,3,2,4-di(p-i-propylbenzylidene)sorbitol, 1,3,2,4-di(p-n-butylbenzylidene)sorbitol, 1,3,2,4-di(p-s-butylbenzylidene)sorbitol, 1,3,2,4-di(p-t-butylbenzylidene)sorbitol, 1,3,2,4-di(p-methoxybenzylidene)sorbitol, 1,3,2,4-di(p-ethoxybenzylidene)sorbitol, 1,3-benzylidene-2,4-p-chlorbenzylidenesorbitol, 1,3-p-chlorbenzylidene-2,4-benzylidenesorbitol, 1,3-p-chlorbenzylidene-2,4-p-methylbenzylidenesorbitol, 1,3-p-chlorbenzylidene-2,4-p-ethylbenzylidenesorbitol, 1,3-p-methylbenzylidene-2,4-p-chlorbenzylidenesorbitol, 1,3-p-ethylbenzylidene-2,4-p-chlorbenzylidenesorbitol, and 1,3,2,4-di(p-chlorbenzylidene)sorbitol. Out of those compounds, 1,3,2,4-di(p-methylbenzylidene)sorbitol or 1,3,2,4-dibenzylidenesorbitol is preferably used.

In view of moldability, an amount of the crystallization accelerator used for the resin composition of the present invention is preferably 0.01 parts by weight to 5 parts by weight, more preferably 0.03 parts by weight to 4 parts by weight, even more preferably 0.05 parts by weight to 3 parts by weight, with respect to 100 parts by weight of (B) the polyalkylene terephthalate block copolymer. In a case where the amount of the crystallization accelerator is less than 0.01 parts by weight, the crystallization accelerator may not sufficiently bring about its effect. In a case where the amount of the crystallization accelerator is more than 5 parts by weight, the effect of the crystallization accelerator may be saturated, and this is not economically preferable. Furthermore, this may cause a deterioration in appearance and property of the resin composition.

Thus obtained composite material is used, in various forms (such as a form of a resin film, a form of a resin molded article, a form of resin foam, a form of a paint, a form of a coating agent, or the like), for various items such as an electronic material, a magnetic material, a catalytic material, a structural material, an optical material, a medical material, an automotive material, and an architectural material. Moreover, according to the highly thermally conductive thermoplastic resin composition of the present invention, it is possible to use a general molding machine for plastic, such as an injection molding machine and an extrusion molding machine which are widely used at present. Therefore, it is possible to easily mold the highly thermally conductive thermoplastic resin composition of the present invention into an article having a complicated shape. Furthermore, the highly thermally conductive thermoplastic resin composition of the present invention has particularly excellent properties, that is, excellent molding processability and high thermal conductivity. Therefore, the highly thermally conductive thermoplastic resin composition of the present invention is remarkably useful as a resin for a casing of a mobile phone, a display, or a computer, each of which internally includes a heat source.

The highly thermally conductive resin composition of the present invention can be suitably used for an injection-molded article such as a home electric appliance, an office-automation equipment part, an audio and visual equipment part, and an automobile interior or exterior part. In particular, the highly thermally conductive resin composition of the present invention can be suitably used as an exterior material of a home electric appliance, office-automation equipment, and the like each of which generates a large amount of heat.

Furthermore, the highly thermally conductive thermoplastic resin composition of the present invention can be suitably used as an exterior material of an electronic device, which internally includes a heat source but is difficult to have a forced cooling mechanism such as a fan, so that heat generated inside the electronic device can be released to the outside. The highly thermally conductive thermoplastic resin composition of the present invention is remarkably useful as a casing, a housing, or an exterior material of a small or mobile electronic device such as: a mobile computer such as a notebook computer; a personal digital assistant (PDA); a mobile phone; a portable game machine; a portable music player; a portable TV/video device; and a portable video camera. Moreover, the highly thermally conductive thermoplastic resin composition of the present invention is remarkably useful as a material such as: a resin for a periphery of a battery of an automobile, an electric train, or the like; a resin for a mobile battery of a home electric appliance; a resin for an electric distribution component such as a circuit breaker; and a sealing material for a motor or the like.

The highly thermally conductive resin composition of the present invention is good in molding processability and impact resistance, as compared with a conventionally known composition. Besides, a molded article obtained from the highly thermally conductive resin composition of the present invention is good in surface property. As such, the highly thermally conductive resin composition of the present invention has properties useful as a part or a casing of the various items.

Specifically, the highly thermally conductive resin composition of the present invention has a great weld strength (for example, weld strength of more than 0.6 J, preferably not less than 0.8 J, more preferably not less than 0.9 J, even more preferably not less than 1.0 J, still even more preferably not less than 1.5 J, most preferably not less than 2.0 J) even in a case where the highly thermally conductive resin composition is filled with a large amount of a filler. Besides, the highly thermally conductive resin composition has high thermal conductivity. Therefore, out of the aforementioned various applications, the highly thermally conductive resin composition of the present invention is useful for (i) a purpose that particularly requires a heat dissipation property and (ii) various injection-molded articles each of which is produced with use of two or more gates and each of which has a weld portion. Furthermore, the highly thermally conductive resin composition of the present invention is useful for an injection-molded article which has a portion that causes a weld portion to be formed in the injection-molded article. For example, according to an injection-molded article having an opening, a boss, or a louver structure, a weld portion is absolutely formed at such a part. Since the highly thermally conductive resin composition of the present invention is capable of having great weld strength even in a case of being filled with a large amount of a filler, the thermally conductive resin composition is applicable to such an injection-molded article practically without a problem.

Furthermore, in a case where the highly thermally conductive resin composition of the present invention is applied to various molded articles, the highly thermally conductive resin composition can be used solely or can be alternatively used, as a structure, in combination with metal or a carbon material when a further higher heat dissipation property is required. As the metal, one that has high thermal conductivity is preferably used. Examples of the metal encompass substances, having thermal conductivity of not less than 40 W/m·K, such as aluminum, copper, magnesium, and alloys of those metals. For example, it is possible to attain a higher heat dissipation property by (i) providing the metal having high thermal conductivity in a vicinity of a heat generating member (e.g., right under the heat generating member) so that heat is effectively diffused and (ii) arranging the highly thermally conductive resin composition of the present invention around the metal. A way of using the metal or the carbon material each having high thermal conductivity is not limited in particular. Note, however, that the metal or the carbon material is preferably used in such a way that the heat of the heat generating member is effectively diffused. Examples of the carbon material encompass a graphite sheet, and one that has thermal conductivity of not less than 500 W/m·K is preferably used.

By selecting the highly thermally conductive inorganic compound which has an electric insulation property, it is possible to attain a high electric insulation property and a high heat dissipation property even in a case where the highly thermally conductive resin composition of the present invention is solely used. Moreover, even in a case where a higher electric insulation property and a higher heat dissipation property are required, it is possible to obtain a heat dissipating structure having a high heat dissipation property while having an electric insulation property, by combining the highly thermally conductive resin composition with the metal or the carbon material each having the high thermal conductivity.

A thermal interface material can be used so as to reduce a thermal resistance generated between the highly thermally conductive resin composition of the present invention and the metal or the carbon material. As the thermal interface material, one that has thermal conductivity of not less than 0.5 W/m·K is preferably used.

The present invention can be arranged as follows.

A highly thermally conductive thermoplastic resin composition of the present invention is a highly thermally conductive thermoplastic resin composition including: (A) a thermoplastic polyester resin having a weight average molecular weight of 50,000 to 200,000; (B) a polyalkylene terephthalate block copolymer composed of a polyether segment and a polyethylene terephthalate segment which includes an ethylene terephthalate unit as a main component; and (C) a highly thermally conductive inorganic compound, the highly thermally conductive thermoplastic resin composition including, with respect to 100 parts by weight of (A) the thermoplastic polyester resin, 20 parts by weight to 200 parts by weight of (B) the polyalkylene terephthalate block copolymer and 20 parts by weight to 250 parts by weight of (C) the highly thermally conductive inorganic compound.

The highly thermally conductive thermoplastic resin composition of the present invention is preferably arranged such that (A) the thermoplastic polyester resin is a polyalkylene terephthalate.

The highly thermally conductive thermoplastic resin composition of the present invention is preferably arranged such that (A) the thermoplastic polyester resin has an IV value of 0.5 to 2.0.

The highly thermally conductive thermoplastic resin composition of the present invention is preferably arranged such that (B) the polyalkylene terephthalate block copolymer is a polyalkylene terephthalate block copolymer composed of a polyether segment and a polyalkylene terephthalate segment, the polyalkylene terephthalate segment including an alkylene terephthalate unit as a main component, the polyether segment (i) having a molecular weight of not less than 400 and (ii) being at least one kind selected from the group consisting of a polyether compound represented by general formula (1) and a polyether compound represented by general formula (2):

$$HO—(R^1O)_k—H \qquad (1)$$

where $R^1$ denotes an alkyl group having 2 to 5 carbon atoms, k denotes an integer of 5 or more, and $R^1$ of $(R^1O)_k$ may be identical to or different from each other;

$$H—(OR^2)_m—O\text{-Ph-}X\text{-Ph-}O—(R^2O)_n—H \qquad (2)$$

where $R^2$ denotes an alkyl group having 2 to 5 carbon atoms, X denotes $—C(CH_3)_2—$ or $—SO_2—$, Ph denotes $C_6H_4$, m and n each independently denote an integer of 1 or more, m+n indicates an integer of 3 or more, and $R^2$ of $(OR^2)_m$ and $(R^2O)_n$ may be identical to or different from each other.

The highly thermally conductive thermoplastic resin composition of the present invention is preferably arranged such that (C) the highly thermally conductive inorganic compound is at least one kind selected from the group consisting of graphite, electrically conductive metal powder, soft magnetic ferrite, carbon fiber, electrically conductive metal fiber, and zinc oxide.

The highly thermally conductive thermoplastic resin composition of the present invention is preferably arranged such that (C) the highly thermally conductive inorganic compound is an electrically insulating highly thermally conductive inorganic compound having thermal conductivity of 20 W/m·K by itself.

The highly thermally conductive thermoplastic resin composition of the present invention is preferably arranged such that (C) the highly thermally conductive inorganic compound is at least one kind selected from the group consisting of talc, boron nitride, aluminum nitride, silicon nitride, aluminum oxide, magnesium oxide, magnesium carbonate, aluminum hydroxide, magnesium hydroxide, beryllium oxide, and diamond.

The highly thermally conductive thermoplastic resin composition of the present invention is preferably arranged so as to further include (D) at least one of a flame retarder and an auxiliary flame retarder.

The highly thermally conductive thermoplastic resin composition of the present invention is preferably arranged such that (D) the at least one of the flame retarder and the auxiliary flame retarder is a halogen flame retarder, a phosphorus flame retarder, an antimony compound, or magnesium hydroxide.

The highly thermally conductive thermoplastic resin composition of the present invention is preferably arranged so as to further include (E) tempered glass fiber.

The highly thermally conductive thermoplastic resin composition of the present invention is preferably arranged such that (E) the tempered glass after extrusion has a length of 0.1 µm to 1000 µm and has a single fiber diameter of 0.1 µm to 50 µm.

A molded article of the present invention is a molded article prepared by injection-molding a highly thermally conductive thermoplastic resin composition of the present invention.

The molded article, prepared by injection-molding the highly thermally conductive thermoplastic resin composition of the present invention, is arranged so as to have a weld portion.

A good heat dissipating structure of the present invention includes: a molded article prepared by injection-molding a highly thermally conductive thermoplastic resin composition of the present invention; and metal or a carbon material.

An electrically insulating good heat dissipating structure of the present invention includes a molded article having an electric insulation property, the molded article being prepared by injection-molding a highly thermally conductive thermoplastic resin composition of the present invention.

A method of producing a molded article having a weld portion of the present invention includes the step of injection-molding, with use of two or more gates, a highly thermally conductive thermoplastic resin composition of the present invention.

A method of producing a good heat dissipating structure of the present invention includes the step of integrating a highly thermally conductive thermoplastic resin composition of the present invention with metal or a carbon material by insert molding.

Another method of producing good heat dissipating structure of the present invention includes the step of integrating a molded article of the present invention with metal or a carbon material by heat welding, ultrasonic welding, or press fitting.

Furthermore, the present invention can encompass a method of producing an electrically insulating good heat dissipating structure, including the step of integrating a highly thermally conductive thermoplastic resin composition, having an electric insulation property, of the present invention with metal or a carbon material by insert molding. Moreover, the present invention can encompass a method of producing an electrically insulating good heat dissipating structure, including the step of integrating a molded article, having an electric insulation property, with metal or a carbon material by heat welding, ultrasonic welding, or press fitting, the molded article being prepared by injection-molding a highly thermally conductive thermoplastic resin composition of the present invention.

Note that, according to the present invention, a method of integrating the highly thermally conductive thermoplastic resin composition or the molded article with metal or carbon material by insert molding, heat welding, ultrasonic welding, or press fitting is not limited in particular, and various known methods can be employed.

EXAMPLES

The present invention is not limited to the embodiments, but can be altered by a skilled person in the art within the scope of the claims. An embodiment derived from a proper combination of technical means each disclosed in a different embodiment is also encompassed in the technical scope of the present invention.

(A) A thermoplastic polyester resin, (B) a polyalkylene terephthalate block copolymer, (C-1) talc (manufactured by Nippon Talc Co., Ltd.), (C-2) boron nitride, (D-1) a flame retarder SAYTEX7010 (manufactured by Albemarle Corporation), (D-2) an auxiliary flame retarder PATOX-P (manufactured by Nippon Seiko Co., Ltd.), and (E) glass fiber T-187H/PL (manufactured by Nippon Electric Glass Co., Ltd.) were put, at a blending ratio shown in Table 1, into a KZW15-45 intermeshing corotating twin-screw extruder (manufactured by TECHNOVEL CORPORATION) through a hopper provided in a vicinity of a root of a screw. Temperatures of the extruder were set so as to gradually increase in such a manner that a temperature in a vicinity of at feed opening was 260° C. and a temperature at a tip of the screw was 280° C. Under such a condition, sample pellets for evaluation were obtained.

Raw materials used in Examples and Comparative Example are as follows. Note here that A-1 indicates APET.
(A) The thermoplastic polyester resin
(A-1): KURAPET (product name) KS710B-8S, manufactured by Kuraray Co., Ltd., having a weight average molecular weight of 140,000
(A-2): RT543, manufactured by Japan Unipet Co., Ltd., having a weight average molecular weight of 75,000
(A-3): NOVAPEX PBK2, manufactured by Mitsubishi Chemical Corporation, having a weight average molecular weight of 61,000

[Molding of Specimens]

The sample pellets thus obtained were dried, and then molded, in a metal mold having a double gate, into respective specimens, each having a weld portion, in accordance with JIS K 7162 Dumbbell Piece 1A with use of an injection molding device.

[Evaluation Method]

Tensile strength of each of the specimens thus obtained was measured with use of a tensile strength tester.

[Measurement of Thermal Conductivity]

The sample pellets obtained in Examples and Comparative Example were dried at 140° C. for 4 hours. The sample pellets were then molded, with use of 75t injecting molding device, into respective plate-shaped specimens, each having a size of 150 mm×80 mm×thickness 1.00 mm, through a Pin gate having a gate size of 0.8 mmΦ and being provided in a central part of a surface of a plain plate. In this manner, highly thermally conductive resin molded articles were obtained.

Thus obtained molded articles, each having the thickness of 1.0 mm, were cut into respective discoid samples each having a diameter of 12.7 mmΦ. Laser light absorbing spray (manufactured by Fine Chemical Japan Co., LTD., blackguard spray: FC-153) was applied to a surface of each of the discoid samples and then dried. Thereafter, thermal diffusivity, in a thickness direction and a surface direction, of the each of the discoid samples was measured with use of LFA447Nanoflash (serving as a Xe flash analyzer) manufactured by NETZSCH.

Further, specific heat capacity of the each of the discoid samples, which were used in measurement of the thermal diffusivity, was measured by DSC (measurement was carried out in accordance with JIS K 7123).

Thereafter, thermal conductivity (W/min·K) in the surface direction of the each of the discoid samples was calculated from a value of the thermal diffusivity thus measured and a value of the specific heat capacity thus measured (specifically, a value obtained by multiplying together the thermal diffusivity, the specific heat capacity, and specific gravity additionally measured).

[Measurement of Weld Strength of Weld Portion of Al Insert Molded Article by DuPont Impact Test]

The sample pellets obtained in Examples and Comparative Example were dried at 140° C. for 4 hours. After that, Al insert molded articles, each having a weld portion, were prepared with use of a 30t injection molding device (see FIG. 1).

The weld portion of each of the Al inserted molded articles thus prepared was subjected to the DuPont impact test so as to calculate 50% failure energy (measurement was carried out in accordance with ASTM D 2794).

Figure 1:
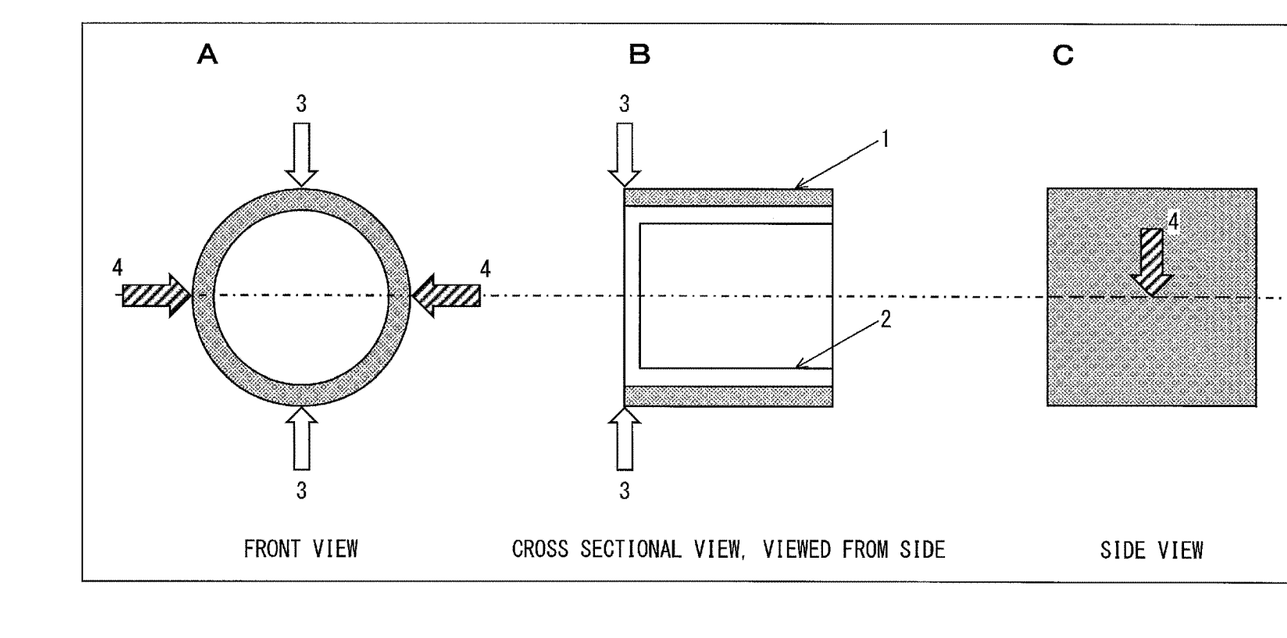
FIG. 1 is a view illustrating an Al insert molded article, produced with use of each of sample pellets obtained in Examples 1 through 5 and Comparative Example 1, so as to carry out the DuPont impact test. A of FIG. 1 is a front view. B of FIG. 1 is a cross sectional view illustrating the Al insert molded article viewed from a side thereof. C of FIG. 1 is a side view.

More specifically, as illustrated in FIG. 1, by arranging a highly thermally conductive resin 1 along an outer circumference of an Al insert part 2, an Al insert molded article made up of the highly thermally conductive resin 1 and the Al insert part 2 was prepared. In so doing, a weld portion 4 was formed in the highly thermally conductive resin 1 of the Al insert molded article. Note that, a size of the Al insert part 2, which has a cylindrical shape, is not limited in particular. For example, a diameter of a circle serving as a bottom surface of the Al insert part 2 can be approximately 3.0 cm to 3.5 cm, and a height of the Al insert part 2 can be approximately 4.0 cm to 4.5 cm. In other words, the size of the Al insert part 2 only needs to be such a size that the Al insert molded article can be subjected to the DuPont impact test.

The DuPont impact test was then carried out with respect to the weld portion 4 of the Al insert molded article so as to calculate the 50% failure energy (the DuPont impact test was carried out in accordance with ASTM D 2794).

Examples 1 to 5 and Comparative Example 1

Table 1 shows the blending ratios and results of Examples and Comparative Example. As is clear from Table 1, it is understood that a composition of the present invention is a resin composition which is filled with a large amount of a filler and which is excellent in weld strength as compared with a composition which is beyond the scope of the present invention.

INDUSTRIAL APPLICABILITY

The foregoing composition can be used, as a material for counteracting heat, in various situations such as electric/electronic industrial fields and an automotive field, and is industrially useful.

REFERENCE SIGNS LIST

1 Highly thermally conductive resin
2 Al insert part
3 Gate
4 Weld portion

The invention claimed is:

1. A highly thermally conductive thermoplastic resin composition comprising:
   (A) a thermoplastic polyester resin having a weight average molecular weight of 50,000 to 200,000, wherein the thermoplastic polyester resin is amorphous polyethylene terephthalate having a heat quantity of melting that is not more than 50 J/g;
   (B) a polyalkylene terephthalate block copolymer composed of a polyether segment and a polyethylene terephthalate segment which includes an ethylene terephthalate unit as a main component; and
   (C) a highly thermally conductive inorganic compound,
   the highly thermally conductive thermoplastic resin composition comprising, with respect to 100 parts by weight of (A) the thermoplastic polyester resin, 20 parts by weight to 200 parts by weight of (B) the polyalkylene terephthalate block copolymer and 20 parts by weight to 250 parts by weight of (C) the highly thermally conductive inorganic compound.

2. The composition as set forth in claim 1, wherein (A) the thermoplastic polyester resin has an IV value of 0.5 to 2.0.

3. The composition as set forth in claim 1, wherein the polyether segment is selected from the group consisting of a polyether compound represented by general formula (1), a polyether compound represented by general formula (2), and mixtures thereof $$HO\text{—}(R^1O)_k\text{—}H \quad (1)$$

TABLE 1

| | | Parts by weight | | | | | |
| --- | --- | --- | --- | --- | --- | --- | --- |
| | Number/Unit | Example 1 | Example 2 | Example 3 | Example 4 | Example 5 | Comparative Example 1 |
| Thermoplastic polyester resin | A-1 | 29 | | | | 29 | |
| | A-2 | | 29 | | 22 | | 17 |
| | A-3 | | | 29 | | | |
| Block copolymer | B | 7 | 7 | 7 | 8 | 7 | 9 |
| Thermally conductive filler | C-1 | 40 | 40 | 40 | 50 | 46 | 54 |
| | C-2 | 6 | 6 | 6 | 4 | | 4 |
| Flame retarder | D-1 | 9 | 9 | 9 | 8 | 9 | 9 |
| Glass fiber | E | 9 | 9 | 9 | 8 | 9 | 8 |
| Tensile strength | MPa | 13.4 | 8.5 | 9.9 | 8.1 | 15 | 7.6 |
| Thermal conductivity | W/Km | 2.0 | 2.0 | 2.0 | 2.6 | 1.8 | 2.1 |
| Weld strength of Al insert molded article | J | 1.4 | 0.9 | 1.0 | 0.8 | 2.1 | 0.6 |

As has been described, it is understood that the thermoplastic resin composition of the present invention is absolutely excellent in molding flowability during injection molding despite being filled with a larger amount of a filler and that a highly thermally conductive thermoplastic resin composition is accordingly obtained.

where $R^1$ denotes an alkyl group having 2 to 5 carbon atoms, k denotes an integer of 5 or more, and $R^1$ of $(R^1O)_k$ may be identical to or different from each other;

$$H\text{—}(OR^2)_m\text{—}O\text{-Ph-}X\text{-Ph-}O\text{—}(R^2O)_n\text{—}H \quad (2)$$

where $R^2$ denotes an alkyl group having 2 to 5 carbon atoms, X denotes —C(CH$_3$)$_2$— or —SO$_2$—, Ph denotes $C_6H_4$, m and n each independently denote an integer of 1 or more, m+n indicates an integer of 3 or more, and $R^2$ of $(OR^2)_m$ and $(R^2O)_n$ may be identical to or different from each other, wherein the polyether segment has a weight average molecular weight of not less than 400.

4. The composition as set forth in claim 1, wherein (C) the highly thermally conductive inorganic compound is at least one kind selected from the group consisting of graphite, electrically conductive metal powder, soft magnetic ferrite, carbon fiber, electrically conductive metal fiber, and zinc oxide.

5. The composition as set forth in claim 1, wherein (C) the highly thermally conductive inorganic compound is an electrically insulating highly thermally conductive inorganic compound having thermal conductivity of 20 W/m·K by itself.

6. The composition as set forth in claim 1, wherein (C) the highly thermally conductive inorganic compound is at least one kind selected from the group consisting of talc, boron nitride, aluminum nitride, silicon nitride, aluminum oxide, magnesium oxide, magnesium carbonate, aluminum hydroxide, magnesium hydroxide, beryllium oxide, and diamond.

7. A composition as set forth in claim 1, further comprising (D) at least one of a flame retarder and an auxiliary flame retarder.

8. The composition as set forth in claim 7, wherein (D) the at least one of the flame retarder and the auxiliary flame retarder is a halogen flame retarder, a phosphorus flame retarder, an antimony compound, or magnesium hydroxide.

9. A composition as set forth in claim 1, further comprising (E) tempered glass fiber.

10. The composition as set forth in claim 9, wherein (E) the tempered glass fiber after extrusion has a length of 0.1 μm to 1000 μm and has a single fiber diameter of 0.1 μm to 50 μm.

11. A molded article prepared by injection-molding a highly thermally conductive thermoplastic resin composition recited in claim 1.

12. The molded article as set forth in claim 11, wherein the molded article has a weld portion.

13. A good heat dissipating structure comprising:
a molded article recited in claim 11; and
metal or a carbon material.

14. An electrically insulating good heat dissipating structure comprising a molded article having an electric insulation property, the molded article being prepared by injection-molding a highly thermally conductive thermoplastic resin composition recited in claim 1.

15. A method of producing a molded article having a weld portion, comprising the step of injection-molding, with use of two or more gates, a highly thermally conductive thermoplastic resin composition recited in claim 1.

16. A method of producing a good heat dissipating structure, comprising the step of integrating a highly thermally conductive thermoplastic resin composition recited in claim 1 with metal or a carbon material by insert molding.

17. A method of producing a good heat dissipating structure, comprising the step of integrating a molded article recited in claim 11 with metal or a carbon material by heat welding, ultrasonic welding, or press fitting.

* * * * *